May 23, 1961 S. W. ENGLE 2,985,843

GAIN CLAMPING DEVICES IN AMPLIFIER CIRCUITS

Filed Nov. 2, 1959

2 Sheets-Sheet 1

United States Patent Office 2,985,843

Patented May 23, 1961

2,985,843

GAIN CLAMPING DEVICES IN AMPLIFIER CIRCUITS

Sam W. Engle, 158 Mauerkircherstrasse, Munich, Germany

Filed Nov. 2, 1959, Ser. No. 850,502

4 Claims. (Cl. 330—138)

(Granted under Title 35, U.S. Code (1952), sec. 266)

The invention described herein may be manufactured and used by or for the Government of the United States for governmental purposes without the payment to me of any royalty thereon in accordance with the provisions of 35 U.S.C. 266.

This invention relates to a gain clamping device for use with level governing amplifiers.

In communications and broadcasting systems it is frequently desirable to maintain the average audio input level of a device at a constant value despite changes in the input level. A common method of achieving a constant average audio level consists in rectifying a sample of the audio material and using the direct current voltage thus obtained to control the gain of a stage within a level governing amplifier. The amplifier is operated so that normal audio level causes gain reduction by an amount equal to the degree of compensation for low audio input level desired.

The disadvantage of such devices is that in the absence of desirable audio material or during low level audio passages, the gain of the amplifier will increase, and thus increase the amplitude of any existing noise level or intentional low passages. This disadvantage is most noticeable in cases where the signal to noise ratio is marginal such as in radio relay material or in program material with a dynamic range.

It is therefore an object of this invention to provide an improved control circuit for a level governing amplifier which eliminates the disadvantage as noted above.

Another object is to provide for suppression of ambient noise. A further object is to provide a gain clamping device which, after any reasonable time delay desired, will clamp the gain of a typical level governing amplifier at any pre-determined point when its average input level goes below a pre-determined value.

The foregoing and related objects are accomplished by the present invention, wherein the audio signal is sampled, rectified and applied to a control tube, thereby controlling the conductive state of said tube. Associated with the space current of the control tube are means for regulating the gain of a controlled amplifier.

Various other objects, advantages and features of the invention will become apparent from the following detailed description taken in conjunction with the accompanying drawings, in which.

Figure 1:
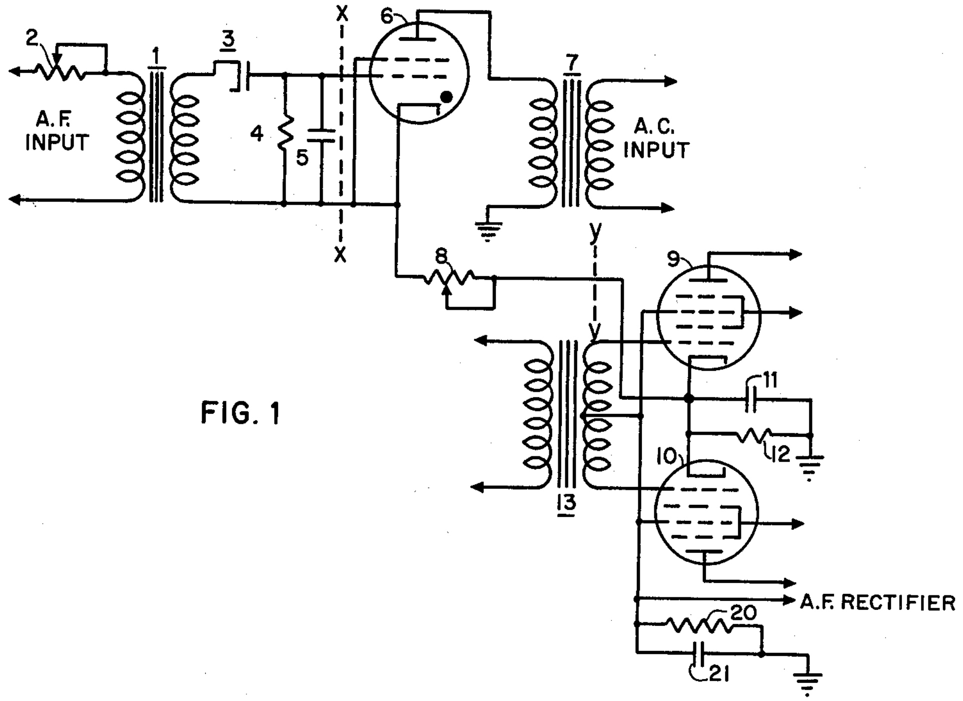
Fig. 1 is a schematic showing one embodiment of the invention.

Referring now to the drawings, and particularly to Fig. 1, there is shown a preferred embodiment of the invention. The audio signal, which is to be controlled, is applied to transformer 1 as well as the normal level governing amplifier circuitry. Potentiometer 2 is a level adjusting control which establishes the threshold at which the clamping device operates. The secondary of the transformer is connected to diode rectifier 3, which is connected to provide a negative direct current voltage. A time constant and filter network 4, 5 is connected between the juncture of the rectifier 3 and control grid of thyratron 6, and the cathode of gas tube 6, preferably a thyratron.

A transformer 7 provides the conventional A.C. plate supply for the thyratron 6. A potentiometer 8 and condenser 11-resistor 12 are connected in the space current path of the thyratron to provide control of amplifiers 9—10. As is noted, resistor 12 is a common cathode bias resistor for the amplifiers, which are connected for push-pull operation and fed from audio transformer 13.

In operation, the normal audio input is rectified and applied to the control grid of thyratron 6, biasing the gas tube to cut-off. Since the plate current is zero no voltage is present on resistor 12 due to thyratron current. In this condition amplifiers 9—10 are operating in the normal manner. As the audio signal falls and rises within a certain pre-determined dynamic range, the normal gain control as typified by the portion of the curve of Fig. 5 from A to B maintains the average output level substantially constant.

In the event the audio input drops below the pre-determined point, or in the absence of an audio signal, the gain would normally follow the dotted line portion of the curve and increase causing high amplification of low signal and noise.

However, as the signal drops below the point determined by the setting of potentiometer 2, the condenser 5 begins to discharge through resistor 4, reducing the negative bias on the thyratron grid. After a pre-determined delay, which is a function of the size of resistor 4, capacitor 5, and the amplitude of the input signal level, the thyratron conducts, and current flows through resistors 8 and 12, creating additional cathode bias on the amplifiers, determined by the setting of potentiometer 8. This results in a reduction in gain in the amplifier stage. The potentiometer 8 is adjusted so that the current through resistor 12 will be the required amount to clamp the gain of the amplifier at the pre-determined operating point, indicated at C in Fig. 5.

Hum in the amplifier 9—10 from the pulsating plate current of the thyratron is prevented as the current is applied in push-push to the common cathode of the push-pull variable gain amplifier, and hence is cancelled out if this stage is well balanced. Adjustments are normally provided in such amplifiers as proper balance is also essential to the normal operation of the amplifier. To forestall any small amount of hum caused by slight amplifier unbalance, resistor 12 may be by-passed by capacitor 11 as shown, in which case the time constant of capacitor 11 and resistor 12 also eliminates any transient due to the sudden conduction of tube 6.

When the thyratron is not conducting, there is no additional current through resistor 12 and the amplifier operation is normal.

Figure 2:
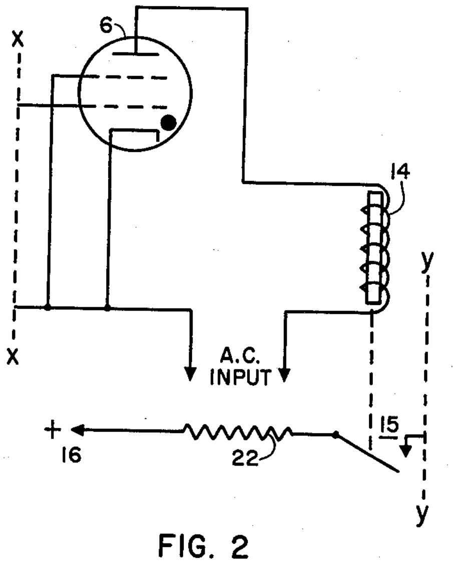
Fig. 2 is a variation of the circuit between the lines X—X and Y—Y of Fig. 1.

In Fig. 2, a relay 14 is connected in series with the tube 6 and alternating current supply. Normally open contacts 15 close when the tube conducts and apply an external positive voltage 16 to the cathode side of resistor 12. The magnitude of the additional current in resistor 12 that this causes is adjusted by means of potentiometer 8 to clamp the gain of the amplifier at the pre-determined operating point.

Figure 3:
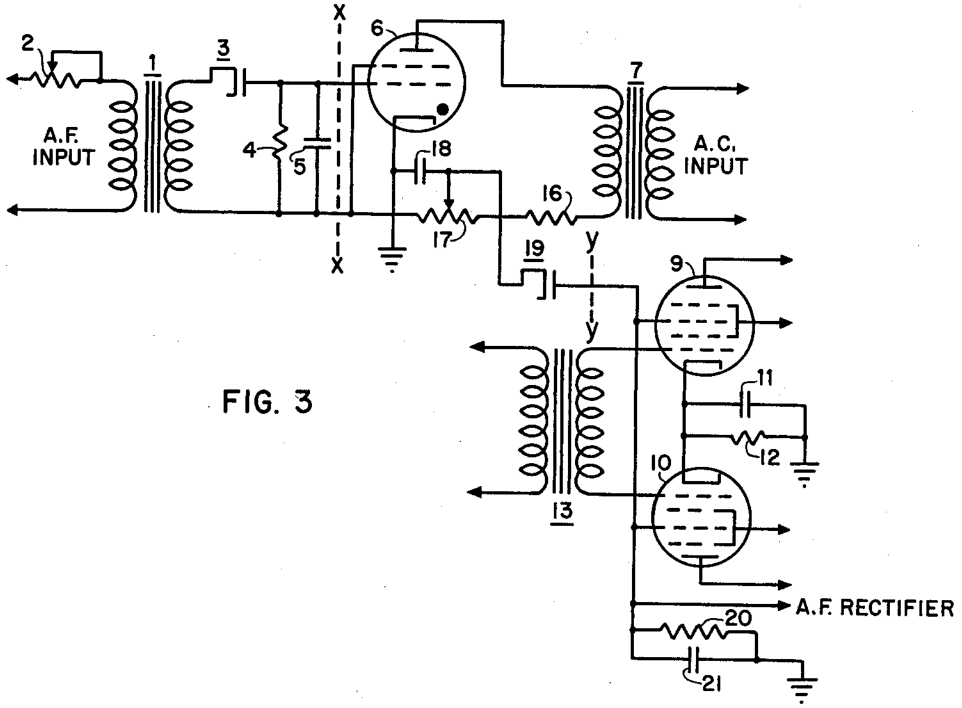
Fig. 3 is a schematic showing another embodiment of the invention.

In Fig. 3, transformer 7 supplies alternating current voltage to the plate and cathode of tube 6 through resistors 16 and 17. Tube 19 is a series gating diode. The RC network 20—21 is connected to the audio frequency (AF) detector for developing the normal gain control voltage, which is applied to the grid circuit of the variable gain amplifier.

Figure 5:
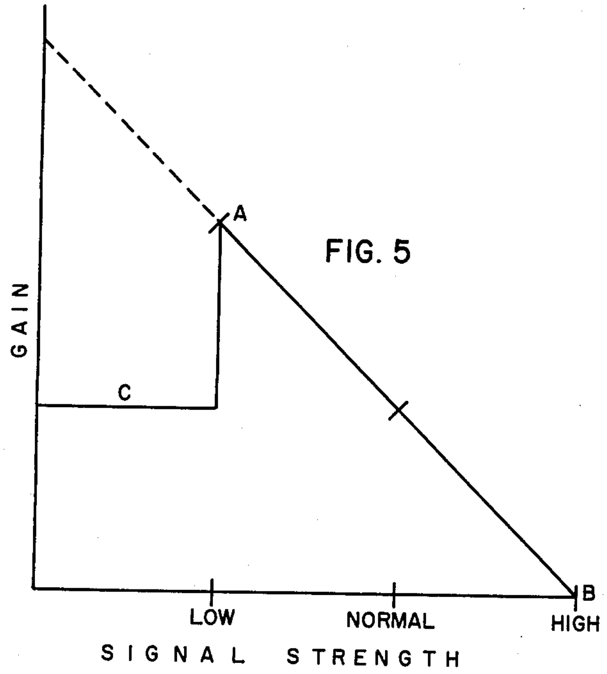
Fig. 5 is a typical response curve for the gain control voltage of the invention.

When normal signal level is being received the control tube 6 is biased beyond cut-off and the gain control of the amplifier stage is normal, along the sloped portion of curve A—B of Fig. 5. When the signal level falls below a pre-determined "low" level, the RC 4—5 discharges to the new level, and tube 6 conducts. Its plate current flows through resistor 17, developing a D.C. voltage which is negative with respect to ground. The negative voltage is filtered by a capacitor 18.

A gating diode 19 admits the negative voltage to the amplifier grid circuit through the RC time constant circuit 20—21 and the gain of the amplifier is clamped at the pre-determined level, which can be adjusted by means of resistor 17.

Figure 4:
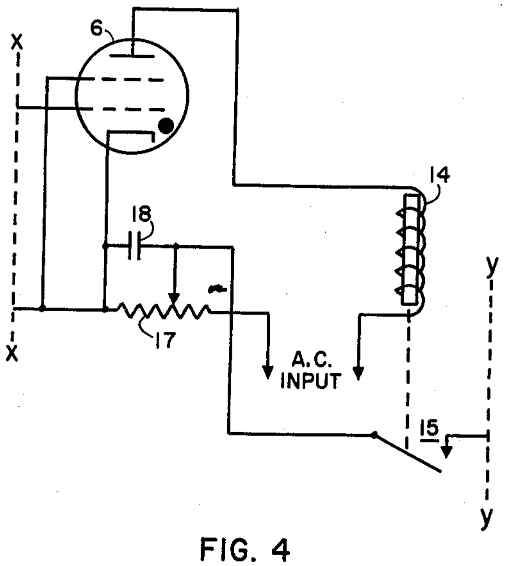
Fig. 4 is a variation of the circuit between the lines X—X and Y—Y of Fig. 3.

The circuit of Fig. 4 is similar to that of Fig. 3 except that a relay 14 has been added in the plate circuit of tube 6, and the contacts of the relay replace the gating diode 19 of Fig. 3.

The operation of Fig. 4 is similar to that of Fig. 3 except that when control tube 6 conducts, the relay 14 closes contacts 15, thereby applying the negative voltage to resistor 17 to clamp the gain of the amplifiers at the pre-determined level. When normal audio level is being received, tube 6 is non-conducting, the relay is de-energized and contacts 15 are open and the amplifier is under normal gain control.

Regardless of the circuit used, an indication of operation of the clamping device may be had most simply by inserting an indicating lamp in the plate circuit of tube 6.

It will be apparent that this invention provides a simple and practical means of clamping the gain of an audio amplifier to prevent the gain from rising to maximum during low level signals, or in the absence of an input audio, and yet permits normal gain control at all other times.

Since many apparently differing embodiments of this invention will occur to one skilled in the art, it is obvious that various changes can be made in the specific details shown and described without parting from the spirit and scope of this invention.

What is claimed is:

1. In combination, a gain controlled audio amplifier stage, means for applying a gain control voltage to said stage, said voltage being proportional to the input audio level, means for rectifying said input audio and providing a negative voltage, said negative voltage being applied to a control tube, said voltage normally biasing said tube to the non-conducting state, a resistor common to the cathode circuits of said control tube and said audio amplifier, means for adjusting the current through said resistor; whereby when said input audio level falls below a pre-determined level, said control tube conducts, and the current through said resistor increases the bias on said amplifier.

2. In combination, a gain controlled audio amplifier stage, means for applying a gain control bias to said stage, said voltage being proportional to the input audio level, means for rectifying said input audio and providing a negative voltage, a clamp circuit responsive to said negative voltage for providing an additional bias to said amplifier stage when said input audio level falls below a certain pre-determined level, said clamp circuit comprising a control tube to which said negative voltage is applied, rendering said control tube non-conductive for normal level input audio, additional biasing means responsive to conduction of said control tube for developing said additional bias in the grid-cathode circuit of said amplifier stage, and means for adjusting said additional bias to approximately the gain control bias provided by a normal level input audio signal.

3. A gain control circuit as defined by claim 2, in which said additional biasing means comprises a separate source of bias voltage, and a relay in the plate circuit of said control tube having contacts connected between said bias voltage and the grid-cathode circuit of said amplifier stage.

4. A gain control circuit as defined by claim 2, in which said additional biasing means comprises a resistor connected in the plate circuit of said control tube, a gating diode connected between the negative end of said resistor and the grid-cathode circuit of said amplifier stage, whereby an additional bias is applied to said amplifier stage when said control tube conducts.

References Cited in the file of this patent

UNITED STATES PATENTS

| | | |
|---|---|---|
| 2,692,306 | Hathaway et al. | Oct. 19, 1954 |
| 2,695,338 | Doriot et al. | Nov. 23, 1954 |
| 2,799,734 | Camp | July 16, 1957 |